(12) United States Patent
Oh et al.

(10) Patent No.: US 10,643,919 B2
(45) Date of Patent: May 5, 2020

(54) FAN-OUT SEMICONDUCTOR PACKAGE

(71) Applicant: SAMSUNG ELECTRONICS CO., LTD., Suwon-si (KR)

(72) Inventors: Hwa Sub Oh, Suwon-si (KR); Doo Hwan Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/057,023

(22) Filed: Aug. 7, 2018

(65) Prior Publication Data

US 2019/0139853 A1 May 9, 2019

(30) Foreign Application Priority Data

Nov. 8, 2017 (KR) .......................... 10-2017-0148216
May 3, 2018 (KR) .......................... 10-2018-0051254

(51) Int. Cl.
*H01L 23/367* (2006.01)
*H01L 23/31* (2006.01)
(Continued)

(52) U.S. Cl.
CPC ............ *H01L 23/367* (2013.01); *H01L 23/13* (2013.01); *H01L 23/3128* (2013.01); *H01L 23/3135* (2013.01); *H01L 23/3677* (2013.01); *H01L 23/3736* (2013.01); *H01L 23/49822* (2013.01); *H01L 23/49838* (2013.01); *H01L 24/19* (2013.01); *H01L 24/20* (2013.01); *H01L 24/32* (2013.01); *H01L 2224/04105* (2013.01);
(Continued)

(58) Field of Classification Search
CPC ..... H01L 23/13; H01L 23/28; H01L 23/3128; H01L 23/3135; H01L 23/36; H01L 23/367; H01L 23/3677; H01L 24/19; H01L 24/20
USPC ......... 257/668, 675, 687; 438/123, 106, 121
See application file for complete search history.

(56) References Cited

U.S. PATENT DOCUMENTS 9,443,828 B2   9/2016  Pagaila et al.
9,735,087 B2   8/2017  Chang et al.
(Continued)

FOREIGN PATENT DOCUMENTS

CN         105161466 A    12/2015
JP         2002-16173 A    1/2002
(Continued)

OTHER PUBLICATIONS

Office Action issued in Taiwanese Patent Application No. 107127573 dated Apr. 30, 2019, with English translation.
(Continued)

*Primary Examiner* — Thinh T Nguyen
(74) *Attorney, Agent, or Firm* — Sughrue Mion, PLLC

(57) ABSTRACT

A fan-out semiconductor package includes a semiconductor chip having an active surface having connection pads disposed thereon and an inactive surface opposing the active surface, a heat dissipation member attached to the inactive surface of the semiconductor chip, an encapsulant covering at least portions of each of the semiconductor chip and the heat dissipation member, and a connection member disposed on the active surface of the semiconductor chip and including a redistribution layer electrically connected to the connection pads. The heat dissipation member has a thickness greater than that of the semiconductor chip.

20 Claims, 17 Drawing Sheets

(51) Int. Cl.
*H01L 23/373* (2006.01)
*H01L 23/498* (2006.01)
*H01L 23/00* (2006.01)
*H01L 23/13* (2006.01)

(52) U.S. Cl.
CPC ............... *H01L 2224/12105* (2013.01); *H01L 2224/32245* (2013.01); *H01L 2224/73267* (2013.01); *H01L 2224/83191* (2013.01); *H01L 2224/83192* (2013.01); *H01L 2224/92244* (2013.01); *H01L 2224/94* (2013.01); *H01L 2224/97* (2013.01); *H01L 2924/3025* (2013.01); *H01L 2924/3511* (2013.01)

(56) References Cited

U.S. PATENT DOCUMENTS

| | | | |
|---|---|---|---|
| 2004/0095727 A1* | 5/2004 | Houle | H01L 23/36 361/704 |
| 2007/0221400 A1 | 9/2007 | Kurashina et al. | |
| 2007/0284711 A1* | 12/2007 | Lee et al. | H01L 23/3677 257/678 |
| 2009/0032933 A1* | 2/2009 | Tracht et al. | H01L 23/3121 257/693 |
| 2009/0160071 A1 | 6/2009 | Shen | |
| 2009/0206470 A1 | 8/2009 | Horiuchi et al. | |
| 2011/0193203 A1 | 8/2011 | Goto et al. | |
| 2011/0215478 A1 | 9/2011 | Yamamichi et al. | |
| 2012/0091572 A1 | 4/2012 | Hamaguchi et al. | |
| 2014/0077394 A1* | 3/2014 | Chang et al. | H01L 23/4334 257/782 |
| 2016/0021753 A1 | 1/2016 | Tomikawa et al. | |
| 2017/0062357 A1* | 3/2017 | Kamgaing et al. | H01L 23/562 |
| 2017/0345795 A1* | 11/2017 | Yang et al. | H01L 25/0567 |
| 2018/0151465 A1* | 5/2018 | Choi et al. | H01L 23/367 |

FOREIGN PATENT DOCUMENTS

| | | |
|---|---|---|
| JP | 2006-269594 A | 10/2006 |
| JP | 2007-266136 A | 10/2007 |
| JP | 2008-210912 A | 9/2008 |
| JP | 2009-194189 A | 8/2009 |
| JP | 2009-194322 A | 8/2009 |
| JP | 2011-165741 A | 8/2011 |
| JP | 2011-187473 A | 9/2011 |
| JP | 2016-25143 A | 2/2016 |
| KR | 10-2009-0089267 A | 8/2009 |
| KR | 10-2009-0106727 A | 10/2009 |
| KR | 10-2012-0023120 A | 3/2012 |
| KR | 10-2014-0059514 A | 5/2014 |
| KR | 10-2017-0121666 A | 11/2017 |

OTHER PUBLICATIONS

Communication dated Sep. 17, 2019 by the Japanese Patent Office in counterpart Japanese Patent Application No. 2018-148939.
Communication dated Sep. 24, 2019, issued by the Korean Intellectual Property Office in counterpart Korean Patent Application No. 10-2018-0051254.

* cited by examiner

FAN-OUT SEMICONDUCTOR PACKAGE

CROSS-REFERENCE TO RELATED APPLICATION(S)

This application claims the benefit of priority to Korean Patent Application Nos. 10-2018-0051254 filed on May 3, 2018 and 10-2017-0148216 field on Nov. 8, 2017, in the Korean Intellectual Property Office, the disclosure of which are incorporated herein by reference in its entirety.

TECHNICAL FIELD

The present disclosure relates to a semiconductor package, and more particularly, to a fan-out semiconductor package in which electrical connection structures may extend outwardly of a region in which a semiconductor chip is disposed.

BACKGROUND

A significant recent trend in the development of technology related to semiconductor chips has been reductions in the size of semiconductor chips. Therefore, in the field of package technology, in accordance with a rapid increase in demand for small-sized semiconductor chips, or the like, the implementation of a semiconductor package having a compact size while including a plurality of pins has been demanded.

One type of semiconductor package technology suggested to satisfy the technical demand, described above, is a fan-out semiconductor package. Such a fan-out package has a compact size and may allow a plurality of pins to be implemented by redistributing electrical connection structures outwardly of a region in which a semiconductor chip is disposed.

Meanwhile, the fan-out package has been recently required to have improved heat dissipation characteristics necessary in a premium application processor (AP).

SUMMARY

An aspect of the present disclosure may provide a fan-out semiconductor package of which heat dissipation characteristics may be excellent and warpage may be effectively controlled.

According to an aspect of the present disclosure, a fan-out semiconductor package may be provided, in which a heat dissipation member, thicker than a semiconductor chip, is attached to an inactive surface of the semiconductor chip and is then packaged.

BRIEF DESCRIPTION OF DRAWINGS

The above and other aspects, features, and advantages of the present disclosure will be more clearly understood from the following detailed description taken in conjunction with the accompanying drawings.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

The present disclosure may, however, be exemplified in many different forms and should not be construed as being limited to the specific embodiments set forth herein. Rather these embodiments are provided so that this disclosure will be thorough and complete, and will fully convey the scope of the disclosure to those skilled in the art.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
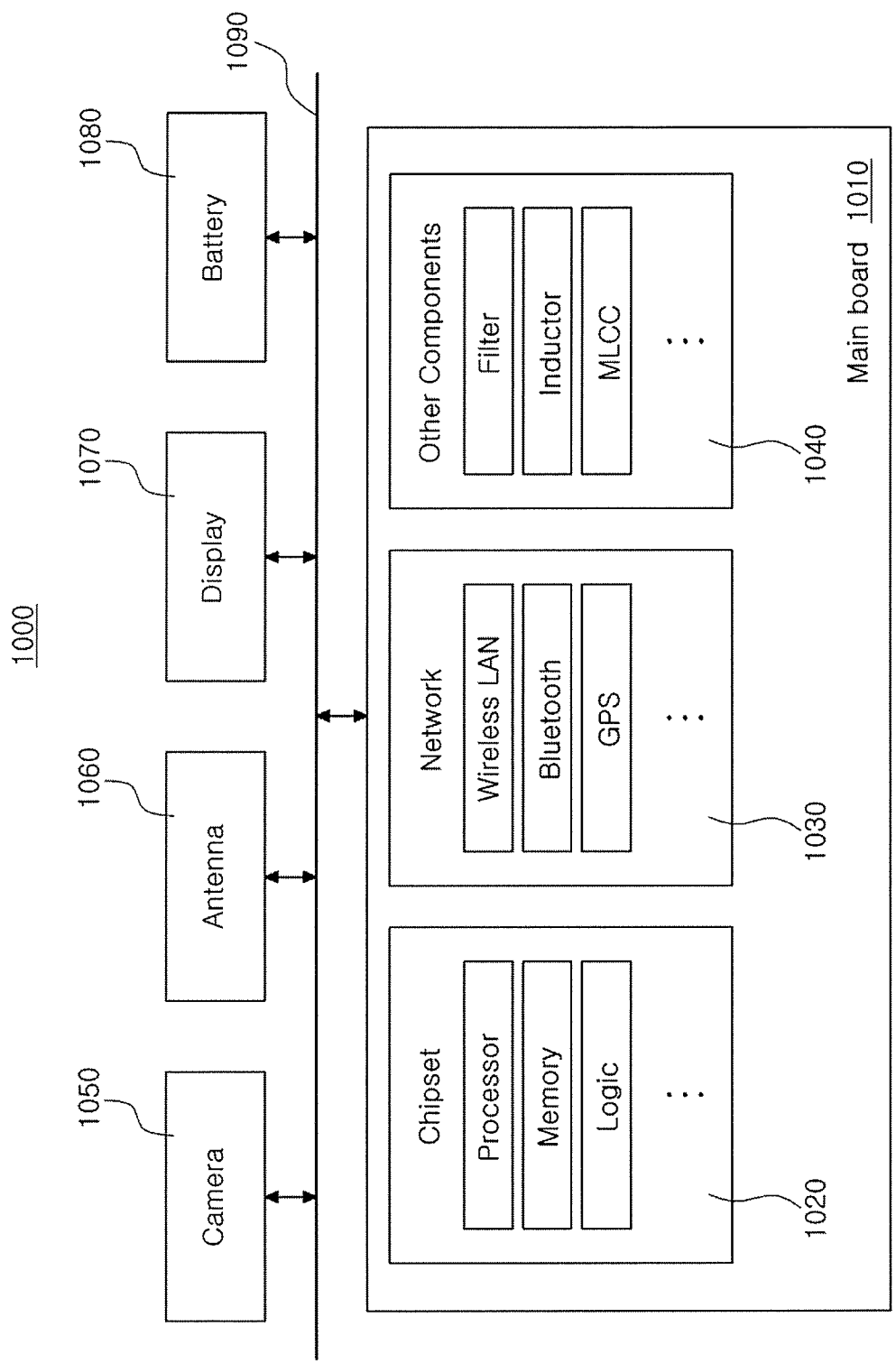
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
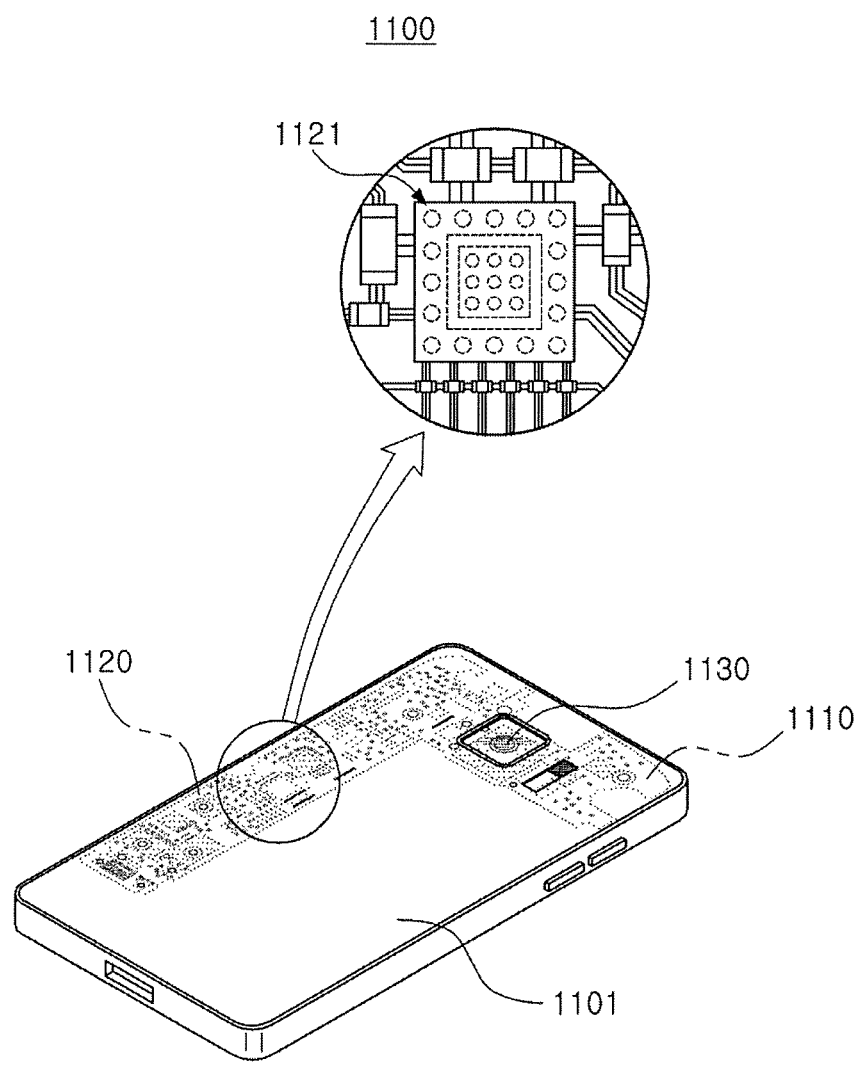
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a mainboard 1110 may be accommodated in a body 1101 of a smartphone 1100, and various electronic components 1120 may be physically or electrically connected to the mainboard 1110. In addition, other components that may or may not be physically or electrically connected to the mainboard 1010, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
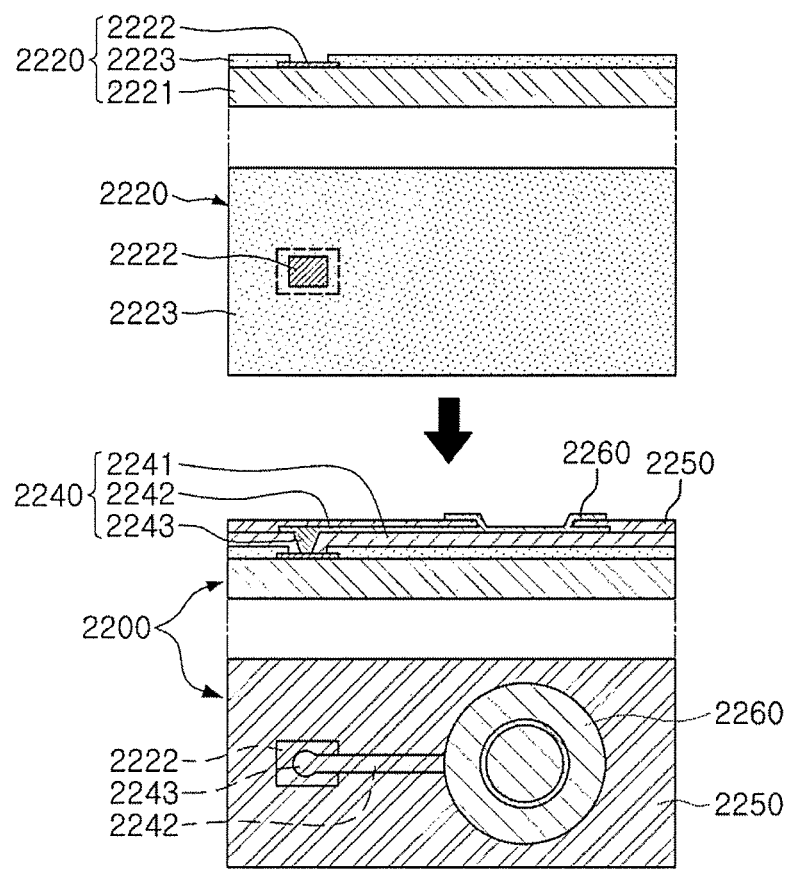
FIGS. 3A and 3B are schematic cross-sectional views illustrating states of a fan-in semiconductor package before and after being packaged.
Figure 3B:
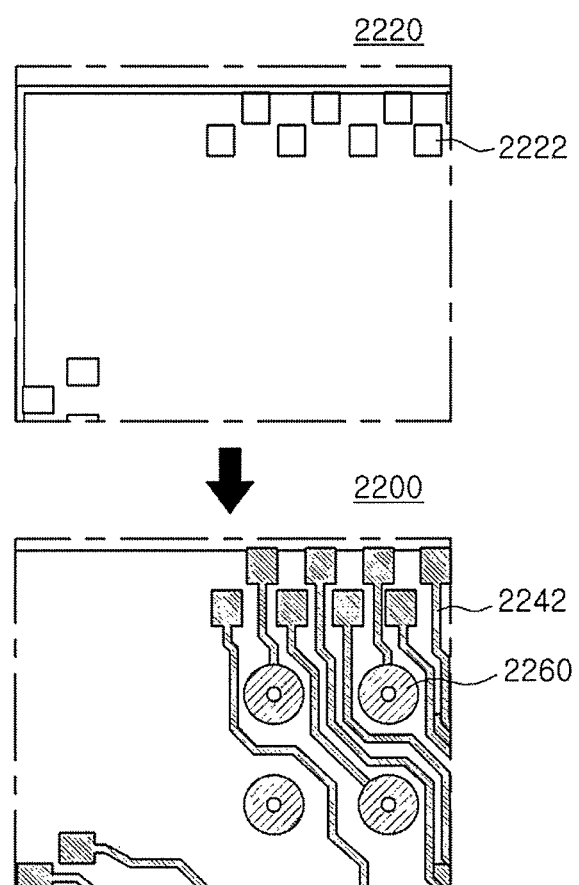

FIGS. 3A and 3B are schematic cross-sectional views illustrating states of a fan-in semiconductor package before and after being packaged.

Figure 4:
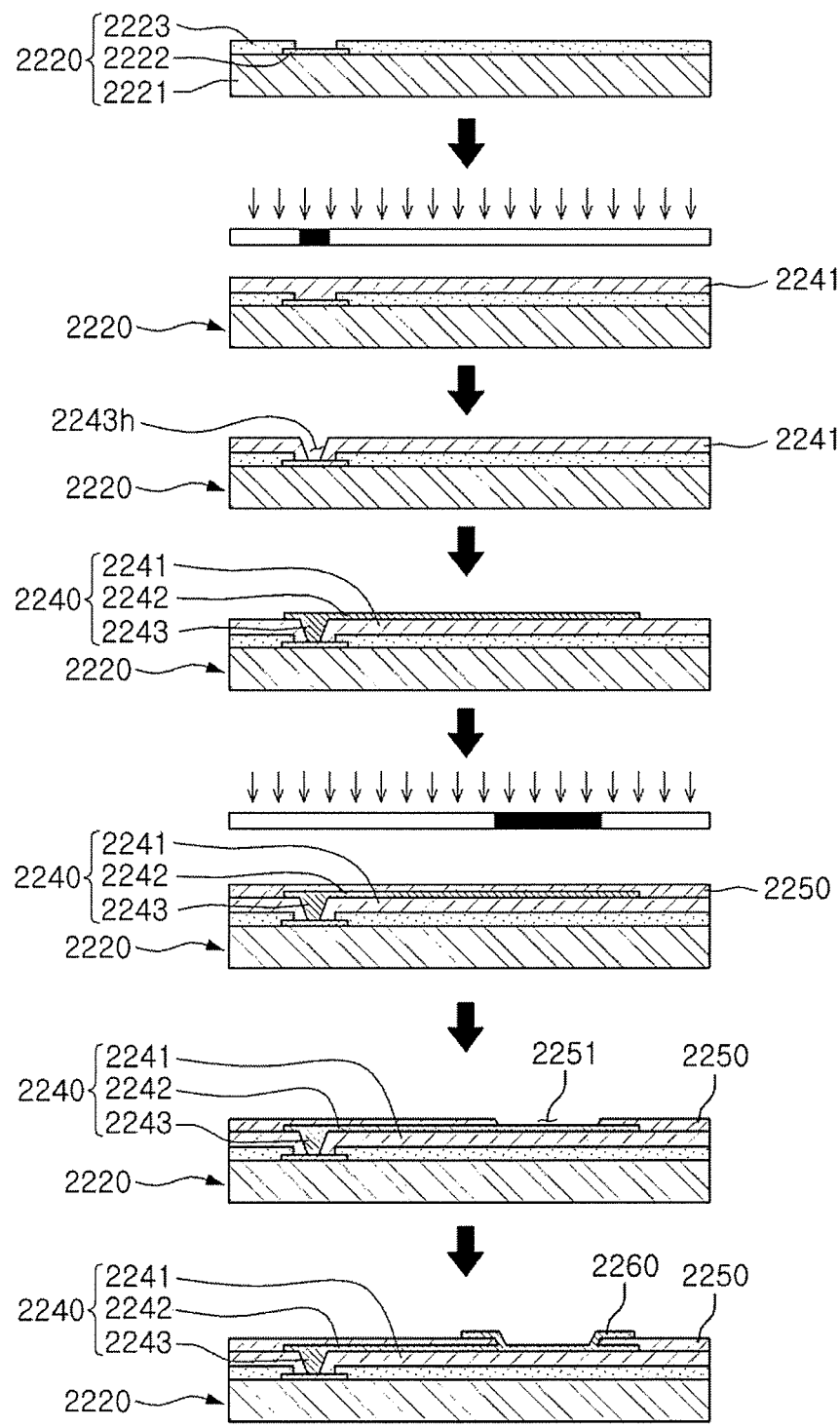
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in electronic component package on the mainboard of the electronic device.

Figure 5:
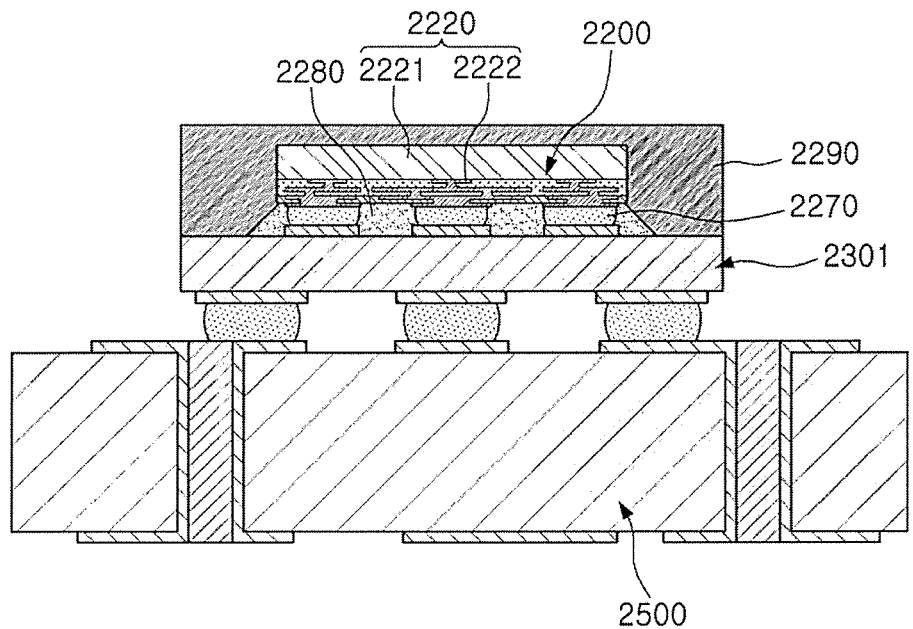
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
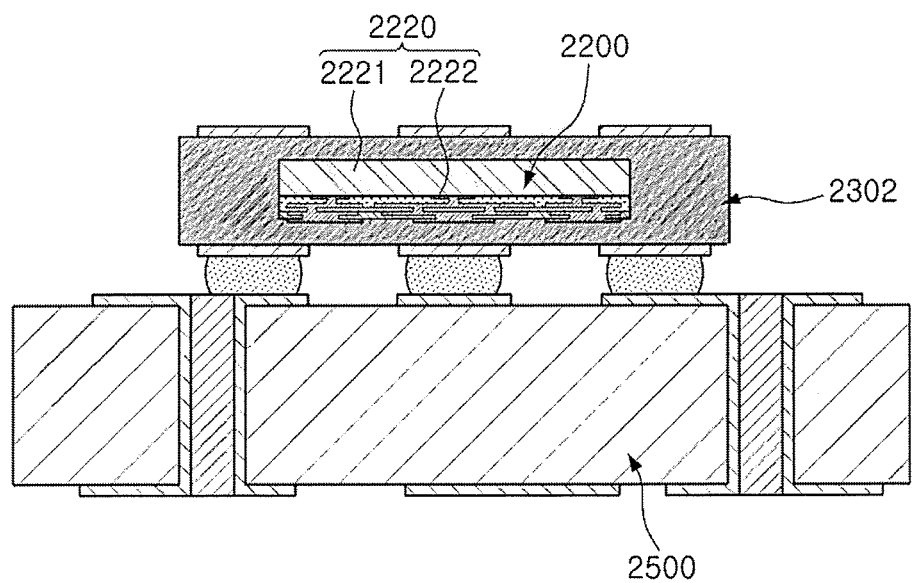
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
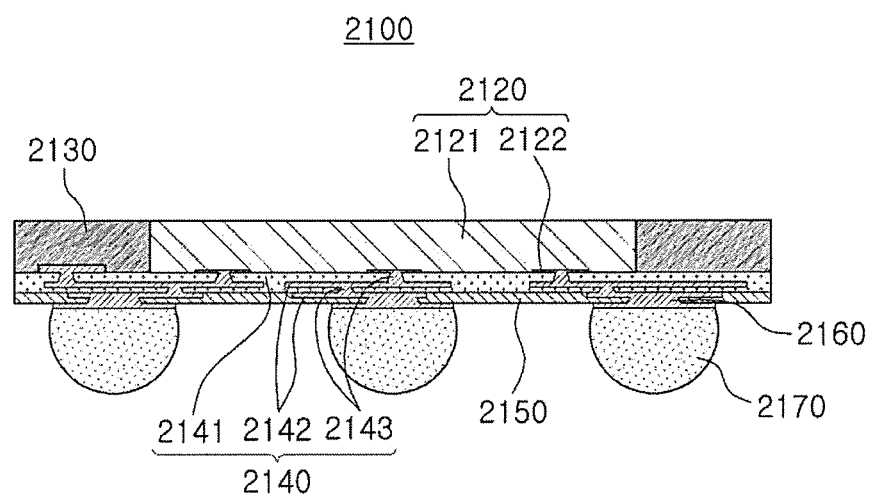
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
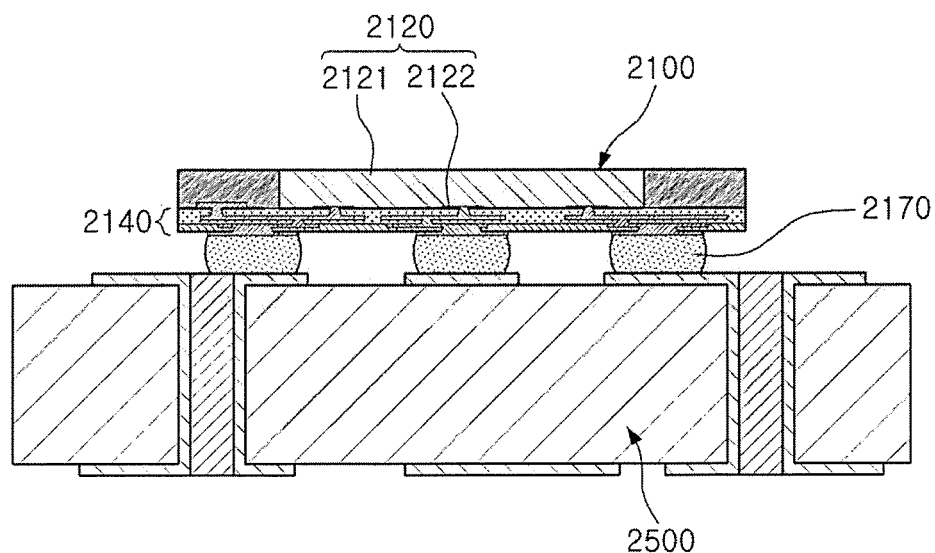
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package of which heat dissipation characteristics may be excellent and warpage may be effectively controlled will hereinafter be described with reference to the drawings.

Figure 9:
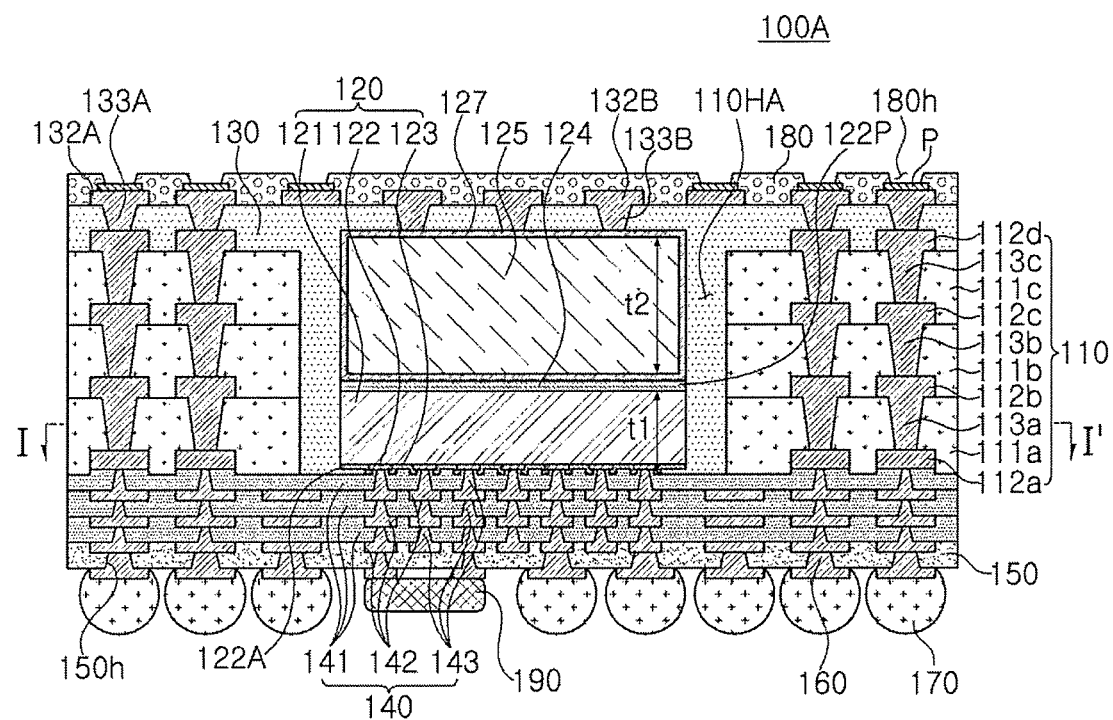
FIG. 9 is a schematic cross-sectional view illustrating an example of a fan-out semiconductor package.

FIG. 9 is a schematic cross-sectional view illustrating an example of a fan-out semiconductor package.

Figure 10:
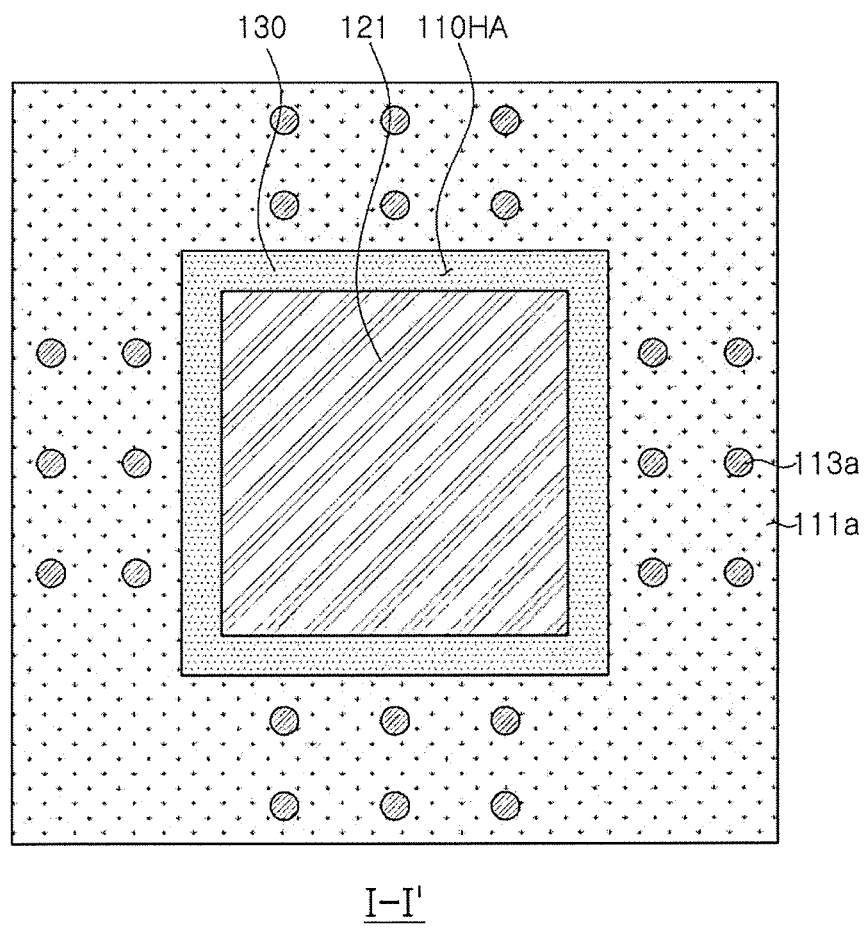
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Referring to FIGS. 9 and 10, a fan-out semiconductor package 100A according to an exemplary embodiment in the present disclosure may include a semiconductor chip 120 having an active surface 122A having connection pads 122 disposed thereon and an inactive surface 122P opposing the active surface 122A, a heat dissipation member 125 attached to the inactive surface 122P of the semiconductor chip 120, an encapsulant 130 encapsulating at least portions of each of the semiconductor chip 120 and the heat dissipation member 125, and a connection member 140 disposed on the active surface 122A of the semiconductor chip 120 and including redistribution layers 142 electrically connected to the connection pads 122. In the fan-out semiconductor package 100A according to the exemplary embodiment, the heat dissipation member 125 may be attached to the inactive surface of the semiconductor chip 120 to effectively dissipate heat of the semiconductor chip 120.

The heat dissipation member 125 may be formed of a metal having an excellent heat dissipation effect, and may be, for example, a copper (Cu) lump. In this case, a high heat dissipation effect may be expected at a low cost. In addition, a warpage suppressing effect may also be expected through a hard property of a metal, a decrease in mismatch between coefficients of thermal expansion (CTEs), and the like. When the copper lump, or the like, is used as the heat dissipation member, surface treatment may be performed on a surface of the heat dissipation member 125 in order to improve close adhesion between the heat dissipation member 125 and the encapsulant 130. For example, the surface of the heat dissipation member 125 may be surface-treated by organic material coating treatment such as silane treatment as in the exemplary embodiment. In this case, an organic coating layer 127 such as a silane coating layer may be formed on the surface of the heat dissipation member 125.

The heat dissipation member 125 may be attached to the inactive surface 122P of the semiconductor chip 120 through an adhesive film 124. The adhesive film 124 may be a general die attach film (DAF). However, the adhesive film is not limited thereto, but may be any adhesive film including high thermal conductivity. When a die attach film, commercially available in the related art, is used, a thickness of the adhesive film 124 needs to be significantly decreased in order to improve a heat dissipation effect. For example, the thickness of the adhesive film 124 may be 10 μm or less, that is, about 1 μm to 10 μm.

A thickness t2 of the heat dissipation member 125 may be greater than a thickness t1 of the semiconductor chip 120. In this case, a heat dissipation effect may be improved, and a difference between heights of the heat dissipation member 125 and a core member 110 to be described below may be significantly decreased at the time of encapsulating the heat dissipation member 125 with the encapsulant 130, and a defect due to a non-uniform encapsulation thickness may thus be significantly decreased. In detail, when the heat dissipation member 125 is attached to the semiconductor chip 120 in a state in which the semiconductor chip 120 is not ground, an overall thickness of the semiconductor chip 120 and the heat dissipation member 125 after the heat dissipation member 125 is attached to the semiconductor chip 120 may be greater than that of the core member 110, such that a problem such as the non-uniform encapsulation thickness may occur. When the thickness t2 of the heat dissipation member 125 is decreased in order to solve such a problem, a heat dissipation effect may not be sufficient. Therefore, the thickness t1 of the semiconductor chip 120 needs to be lower than the thickness t2 of the heat dissipation member 125. In this regard, the thickness t1 of the semiconductor chip 120 may be about 0.4 to 0.6 times the thickness t2 of the heat dissipation member 125.

The encapsulant 130 may be formed of a material including an insulating resin and an inorganic filler. In this case, a content of inorganic filler in the encapsulant 130 may be higher than that of inorganic filler in a general molding material or encapsulant in order to increase thermal conductivity. For example, the content of inorganic filler in the encapsulant 130 may be 60 wt % to 80 wt %, but is not limited thereto.

The fan-out semiconductor package 100A may further include a core member 110 having a through-hole 110H. When the core member 110 is introduced, warpage of the fan-out semiconductor package may be more effectively controlled. Particularly, when a plurality of wiring layers 112a, 112b, 112c, and 112d formed of a metal are formed in the core member 110, rigidity of the fan-out semiconductor package 100A may be more effectively maintained. The adhesive film 124 and the heat dissipation member 125 may be disposed in the through-hole 110H of the core member 110, similar to the semiconductor chip 120. As described below, the heat dissipation member 125 may be attached to the inactive surface 122P of the semiconductor chip 120 in a wafer state through the adhesive film 124, the semiconductor chip 120 in the wafer state to which the heat dissipation member 125 is attached may be diced by a dicing process, and the heat dissipation member 125 may be disposed in the through-hole 110H in a state in which it is attached to the semiconductor chip 120 as described above. In this case, side surfaces of the semiconductor chip 120, side surfaces of the adhesive film 124, and side surfaces of the heat dissipation member 125 may be disposed on substantially the same levels. Therefore, when the through-hole 110H is filled with the encapsulant 130, a negative effect such as a void defect, or the like, may be significantly decreased. When the organic coating layer 127 is formed on the side surfaces of the heat dissipation member 125, side surfaces of the organic coating layer 127 may be disposed on levels that are substantially the same as those of the side surfaces of the semiconductor chip 120 and the side surfaces of the adhesive film 124.

The fan-out semiconductor package 100A may further include a heat dissipation pattern layer 132B disposed on the encapsulant 130 and heat dissipation vias 133B penetrating through at least portions of the encapsulant 130 and connecting the heat dissipation pattern layer 132B and the heat dissipation member 125 to each other. When the heat dissipation pattern layer 132B and the heat dissipation vias 133B are introduced, heat dissipated through the heat dissipation member 125 may be more effectively dissipated upwardly of the fan-out semiconductor package 100A.

The fan-out semiconductor package 100A may further include a backside wiring layer 132A disposed on the encapsulant 130 and backside vias 133A penetrating through at least portions of the encapsulant 130 and electrically connecting the backside wiring layer 132A and the uppermost wiring layer 112d of the core member 110 to each other. In addition, the fan-out semiconductor package 100A according to the exemplary embodiment may further include a cover layer 180 disposed on the encapsulant 130 and having openings 180h exposing at least portions of the backside wiring layer 132A. In this case, a surface treatment layer P formed by plating a metal such as a noble metal may be disposed on a surface of the exposed backside wiring layer 132A. In addition, the fan-out semiconductor package 100A may further include a passivation layer 150 disposed beneath the connection member 140 and having openings 150h exposing at least portions of the lowermost of the redistribution layers 142 of the connection member 140, a plurality of underbump metals 160 formed in the openings 150h of the passivation layer 150 and connected to the exposed redistribution layer 142, and a plurality of electrical connection structures 170 disposed beneath the passivation layer 150 and connected to the plurality of underbump metals 160. In addition, the fan-out semiconductor package 100A may further include a surface mounting component 190 surface-mounted on a lower surface of the passivation layer 150.

The respective components included in the fan-out semiconductor package 100A will hereinafter be described in more detail.

The core member 110 may improve rigidity of the fan-out semiconductor package 100A depending on certain materials, and serve to secure uniformity of a thickness of the encapsulant 130. When the wiring layers 112a, 112b, 112c, and 112d, connection via layers 113a, 113b, and 113c, and the like, are formed in the core member 110, the fan-out semiconductor package 100A may be utilized as a package-on-package (POP) type package. The core member 110 may have the through-hole 110H. The semiconductor chip 120 to which the heat dissipation member 125 is attached through the adhesive film 124 may be disposed in the through-hole 110H to be spaced apart from the core member 110 by a predetermined distance. Side surfaces of the semiconductor chip 120 and the heat dissipation member 125 may be surrounded by the core member 110. However, such a form is only an example and may be variously modified to have other forms, and the core member 110 may perform another function depending on such a form.

The core member 110 may include a first insulating layer 111a in contact with the connection member 140, a first wiring layer 112a in contact with the connection member 140 and embedded in the first insulating layer 111a, a second wiring layer 112b disposed on the other surface of the first insulating layer 111a opposing one surface of the first insulating layer 111a in which the first wiring layer 112a is embedded, a second insulating layer 111b disposed on the first insulating layer 111a and covering the second wiring layer 112b, a third wiring layer 112c disposed on the second insulating layer 111b, a third insulating layer 111c disposed on the second insulating layer 111b and covering the third wiring layer 112c, and a fourth wiring layer 112d disposed on the third insulating layer 111c. The first to fourth wiring layers 112a, 112b, 112c, and 112d may be electrically connected to the connection pads 122. The first to fourth wiring layers 112a, 112b, 112c, and 112d may be electrically connected to each other through the first to third connection via layers 113a, 113b, and 113c, respectively.

When the first wiring layer 112a is embedded in the first insulating layer 111a, a step portion generated due to a thickness of the first wiring layer 112a may be significantly reduced, and an insulating distance of the connection member 140 may thus be constant. A lower surface of the first wiring layer 112a of the core member 110 may be disposed on a level above a lower surface of the connection pad 122 of the semiconductor chip 120. That is, the first wiring layer 112a may be recessed in the first insulating layer 111a, such that a lower surface of the first insulating layer 111a and a lower surface of the first wiring layer 112a may have a step portion therebetween. In this case, a phenomenon in which a material of an encapsulant 130 bleeds to pollute the first wiring layer 112a may be prevented. The second and third wiring layers 112b and 112c may be disposed on a level between the active surface 122A and the inactive surface of the semiconductor chip 120. The core member 110 may be manufactured at a sufficient thickness by a substrate process, or the like, while the connection member 140 may be manufactured at a small thickness by a semiconductor process, or the like. Therefore, a thickness of each of the wiring layers 112a, 112b, 112c, and 112d of the core member 110 may be greater than that of each of the redistribution layers 142 of the connection member 140.

A material of each of the insulating layers 111a, 111b, and 111c is not particularly limited. For example, an insulating material may be used as the material of each of the insulating layers 111a, 111b, and 111c. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. Alternatively, a PID resin may also be used as the insulating material.

The wiring layers 112a, 112b, 112c, and 112d may serve to redistribute the connection pads 122 of the semiconductor chip 120. A material of each of the wiring layers 112a, 112b, 112c, and 112d may be a conductive material such as copper (Cu), aluminum (Al), silver (Ag), tin (Sn), gold (Au), nickel (Ni), lead (Pb), titanium (Ti), or alloys thereof. The wiring layers 112a, 112b, 112c, and 112d may perform various functions depending on designs of corresponding layers. For example, the wiring layers 112a, 112b, 112c, and 112d may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, 112c, and 112d may include via pads, wire pads, electrical connection structure pads, and the like.

The connection via layers 113a, 113b, and 113c may electrically connect the wiring layers 112a, 112b, 112c, and 112d formed on different layers to each other, resulting in an electrical path in the core member 110. A material of each of the connection via layers 113a, 113b, and 113c may be a conductive material. Each of the connection via layers 113a, 113b, and 113c may be completely filled with the conductive material, or the conductive material may also be formed along a wall of each of via holes. Meanwhile, all the connection via layers 113a, 113b, and 113c may have tapered shapes of which directions are the same as each other, that is, tapered shapes of which upper diameters are greater than lower diameters, for a reason in a process.

The semiconductor chip 120 may be an integrated circuit (IC) provided in an amount of several hundred to several million or more elements integrated in a single chip. In this case, the IC may be, for example, a processor chip (more specifically, an application processor (AP)) such as a central processor (for example, a CPU), a graphics processor (for example, a GPU), a field programmable gate array (FPGA), a digital signal processor, a cryptographic processor, a microprocessor, a micro controller, or the like. However, the IC is not limited thereto, but may also be another kind of IC such as a memory or a power management element.

The semiconductor chip 120 may be formed on the basis of an active wafer. In this case, a base material of a body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), copper (Cu), or the like. A passivation layer 123 exposing the connection pads 122 may be formed on an active surface 122A of the body 121, and may be an oxide layer, a nitride layer, or the like, or a double layer of an oxide layer and a nitride layer. A lower surface of the connection pad 122 may have a step portion with respect to a lower surface of the encapsulant 130 through the passivation layer 123. Therefore, the encapsulant 130 may fill at least portions of a space between the passivation layer 123 and the connection member 140. In this case, a phenomenon that the encapsulant 130 bleeds into the lower surface of the connection pad 122 may be prevented to some degree. An insulating layer (not illustrated), and the like, may also be further disposed in other required positions. The semiconductor chip 120 may be a bare die. Therefore, the connection pads 122 may be in physical contact with connection vias 143 of the connection member 140. However, depending on a kind of semiconductor chip 120, a separate redistribution layer (not illustrated) may further be formed on the active surface 122A of the semiconductor chip 120, and bumps (not illustrated), or the like, may be connected to the connection pads 122.

The adhesive film 124 may be a general die attach film (DAF). However, the adhesive film is not limited thereto, but may be any adhesive film including a material having high thermal conductivity. When a die attach film commercially available in the related art is used, a thickness of the adhesive film 124 is selected to improve a heat dissipation effect. For example, the thickness of the adhesive film 124 may be 10 μm or less, that is, about 1 μm to 10 μm.

The heat dissipation member 125 may be formed of a metal having an excellent heat dissipation effect, and may be, for example, a copper (Cu) lump. In this case, a high heat dissipation effect may be expected at a relatively low cost. In addition, a warpage suppressing effect may also be expected because of the stiffness of the metal, a decrease in mismatch between CTEs, and the like. When the copper lump, or the like, is used as the heat dissipation member, surface treatment may be performed on a surface of the heat dissipation member 125 in order to improve close adhesion between the heat dissipation member 125 and the encapsulant 130. For example, the surface of the heat dissipation member 125 may be surface-treated by organic material coating treatment such as silane treatment as in the exemplary embodiment. In this case, an organic coating layer 127 such as a silane coating layer may be formed on the surface of the heat dissipation member 125.

The thickness t2 of the heat dissipation member 125 may be greater than the thickness t1 of the semiconductor chip 120. In this case, a heat dissipation effect may be improved, and a difference between heights of the heat dissipation member 125 and a core member 110 to be described below may be significantly decreased at the time of encapsulating the heat dissipation member 125 with the encapsulant 130, and a defect due to a non-uniform encapsulation thickness may thus be significantly decreased. In detail, when the heat dissipation member 125 is attached to the semiconductor chip 120 in a state in which the semiconductor chip 120 is not ground, an overall thickness of the semiconductor chip 120 and the heat dissipation member 125 after the heat dissipation member 125 is attached to the semiconductor chip 120 may be greater than that of the core member 110. This may result in non-uniform encapsulation thickness. When the thickness t2 of the heat dissipation member 125 is decreased in order to solve such a problem, a heat dissipation effect may be adversely affected. Therefore, the thickness t1 of the semiconductor chip 120 may be reduced to be lower than the thickness t2 of the heat dissipation member 125. In this regard, the thickness t1 of the semiconductor chip 120 may be about 0.4 to 0.6 times the thickness t2 of the heat dissipation member 125.

The encapsulant 130 may protect the core member 110, the semiconductor chip 120, the adhesive film 124, the heat dissipation member 125, and the like. An encapsulation form of the encapsulant 130 is not particularly limited, but may be a form in which the encapsulant 130 surrounds at least portions of the core member 110, the semiconductor chip 120, the adhesive film 124, the heat dissipation member 125, and the like. For example, the encapsulant 130 may cover upper portions of the core member 110 and the heat dissipation member 125, and fill at least portions of the through-hole 110H to cover side portions of the adhesive film 124 and the semiconductor chip 120. The encapsulant 130 may fill the through-hole 110H to thus serve as an adhesive and reduce buckling of the semiconductor chip 120 depending on certain materials.

A material of the encapsulant 130 is not particularly limited. For example, an insulating material may be used as the material of the encapsulant 130. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, ET, or the like. Alternatively, a photoimagable encapsulant (PIE) resin may also be used.

When the encapsulant 130 is formed of a material including an insulating resin and an inorganic filler, a content of inorganic filler in the encapsulant 130 may be higher than that of inorganic filter in a general molding material or encapsulant in order to increase thermal conductivity. For example, the content of inorganic filler in the encapsulant 130 may be 60 wt % to 80 wt %, but is not limited thereto.

A material of each of the backside wiring layer 132A and the backside vias 133A may be a conductive material such as copper (Cu), aluminum (Al), silver (Ag), tin (Sn), gold (Au), nickel (Ni), lead (Pb), titanium (Ti), or alloys thereof. A material of each of the heat dissipation pattern layer 132B and the heat dissipation vias 133B may also be the conductive material described above. The backside wiring layer 132A may perform various functions depending on a design. For example, the backside wiring layer 132A may include ground (GND) patterns, power (PWR) patterns, signal (S) patterns, and the like. Each of the backside vias 133A and the heat dissipation vias 133B may have a tapered shape of which a direction is the same as that of each of the connection via layers 113a, 113b, and 113c of the core member 110.

The connection member 140 may redistribute the connection pads 122 of the semiconductor chip 120. Several tens to several hundreds of connection pads 122 of the semiconductor chip 120 having various functions may be redistributed by the connection member 140, and may be physically or electrically externally connected through the electrical connection structures 170 depending on functions.

The connection member 140 may include insulating layers 141 disposed on the core member 110 and the active surface 122A of the semiconductor chip 120, the redistribution layers 142 disposed on the insulating layers 141, and the connection vias 143 penetrating through the insulating layers 141 and connecting the connection pads 122 and the redistribution layers 142 to each other. A case in which the connection member 140 includes a plurality of insulating layers, a plurality of redistribution layers, and a plurality of via layers is illustrated in the drawings, but the connection member 140 may include smaller numbers or larger numbers of insulating layers, redistribution layers, and via layers than those illustrated in the drawings depending on a design.

A material of each of the insulating layers 141 may be an insulating material. In this case, a photosensitive insulating material such as a PID resin may also be used as the insulating material. That is, each of the insulating layers 141 may be a photosensitive insulating layer. When the insulating layer 141 has photosensitive properties, the insulating layer 141 may be formed to have a smaller thickness, and a fine pitch of the connection via 143 may be achieved more easily. Each of the insulating layers 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent. However, the insulation layers 141 are not limited thereto.

The redistribution layers 142 may substantially serve to redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include various pad patterns, and the like.

The connection vias 143 may electrically connect the redistribution layers 142, the connection pads 122, and the like, formed on different layers to each other, resulting in an electrical path in the fan-out semiconductor package 100A. A material of each of the connection vias 143 may be a conductive material such as copper (Cu), aluminum (Al), silver (Ag), tin (Sn), gold (Au), nickel (Ni), lead (Pb), titanium (Ti), or alloys thereof. Each of the connection vias 143 may be completely filled with the conductive material, or the conductive material may also be formed along a wall of each of via holes. Meanwhile, each of the connection vias 143 of the connection member 140 may have a tapered shape of which a direction is opposite to that of each of the connection via layers 113a, 113b, and 113c of the core member 110. That is, an upper diameter of each of the connection vias 143 may be smaller than a lower diameter of each of the connection vias 143.

The passivation layer 150 may protect the connection member 140 from external physical or chemical damage. The passivation layer 150 may have openings 150h exposing at least portions of the lowermost redistribution layer 142 of the connection member 140. The number of openings 150h formed in the passivation layer 150 may be several tens to several thousands. The surface treatment layer (not illustrated) may be formed by plating such as noble metal plating on a surface of the exposed redistribution layer 142. A material of the passivation layer 150 is not particularly limited. For example, an insulating material may be used as the material of the passivation layer 150. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The underbump metals 160 may improve connection reliability of the electrical connection structures 170 to improve board level reliability of the fan-out semiconductor package 100A. The underbump metals 160 may be connected to the redistribution layer 142 of the connection member 140 exposed through the openings 150h of the passivation layer 150. The underbump metals 160 may be formed in the openings 150h of the passivation layer 150 by any known metallization method using any known conductive metal such as a metal, but is not limited thereto.

The electrical connection structures 170 may physically or electrically externally connect the fan-out semiconductor package 100A. For example, the fan-out semiconductor package 100A may be mounted on the mainboard of the electronic device through the electrical connection structures 170. Each of the electrical connection structures 170 may be formed of a low melting point metal, for example, a solder such as tin (Sn)-aluminum (Al)-copper (Cu), or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 122. More or less electrical connection structures 170 may be provided in certain embodiments. When the electrical connection structures 170 are solder balls, the electrical connection structures 170 may cover side surfaces of the underbump metals 160 extending onto one surface of the passivation layer 150, and connection reliability may be more excellent. At least one of the electrical connection structures 170 may be disposed in a fan-out region. The fan-out region refers to a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

The cover layer 180 may protect the backside wiring layer 132A and/or the heat dissipation pattern layer 132B from external physical or chemical damage. The cover layer 180 may have the openings 180h exposing at least portions of the backside wiring layer 132A. The number of openings 180h formed in the cover layer 180 may be several tens to several thousands. The surface treatment layer P may be formed on the surface of the exposed backside wiring layer 132A. A material of the cover layer 180 is not particularly limited. For example, an insulating material may be used as the material of the cover layer 180. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The surface mounting component 190 may be mounted on the lower surface of the passivation layer 150 through surface mounting technology (SMT). The surface mounting component 190 may be any known passive component such as a capacitor, an inductor, or the like, but is not limited thereto. The surface mounting component 190 may be an active component, if necessary. The surface mounting components 190 may be electrically connected to the connection pads 120 of the semiconductor chip 120 through the redistribution layers 142 of the connection member 140.

Although not illustrated, a plurality of semiconductor chips 120 performing functions that are the same as or different from each other may be disposed in the through-hole 110H, if necessary. In addition, a separate passive component such as an inductor, a capacitor, or the like, may be disposed in the through-hole 110H, if necessary.

Figure 11A:
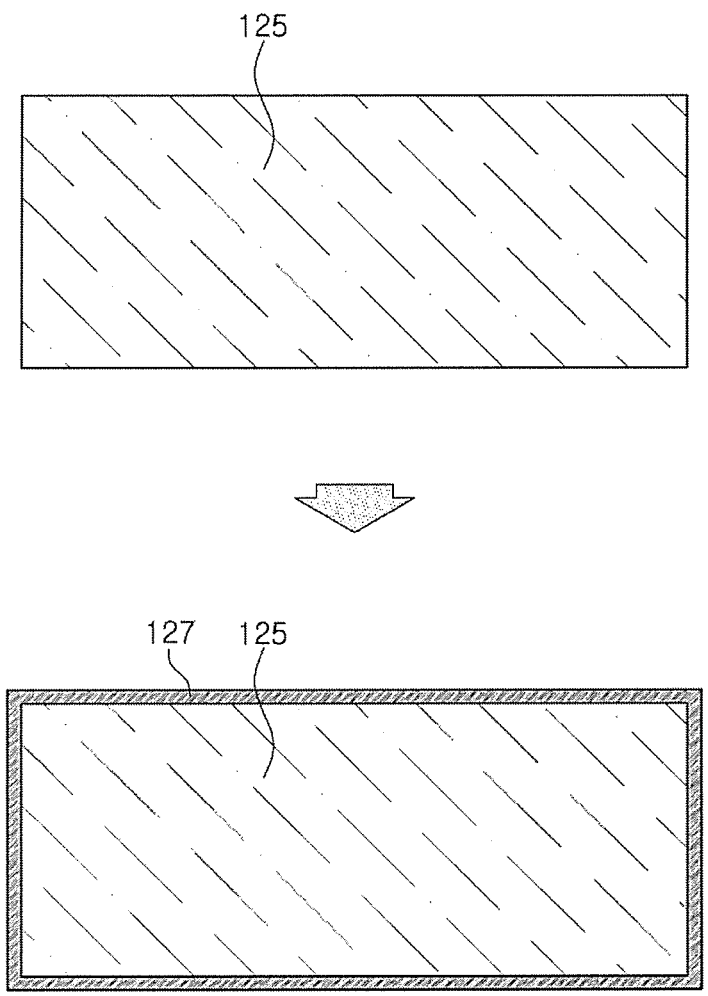
FIG. 11A is schematic views illustrating a process of forming an organic coating layer on a heat dissipation member.

FIG. 11A depicts schematic views illustrating a process of forming an organic coating layer on a heat dissipation member.

Referring to FIG. 11A, the heat dissipation member 125 may be surface-treated by the organic material coating treatment such as the silane treatment. In this case, as illustrated in FIG. 11A, the organic coating layer 127 such as the silane coating layer may be formed on the surface of the heat dissipation member 125. As described above, the close adhesion between the heat dissipation member 125 and the encapsulant 130 may be improved through the surface treatment.

Figure 11B:
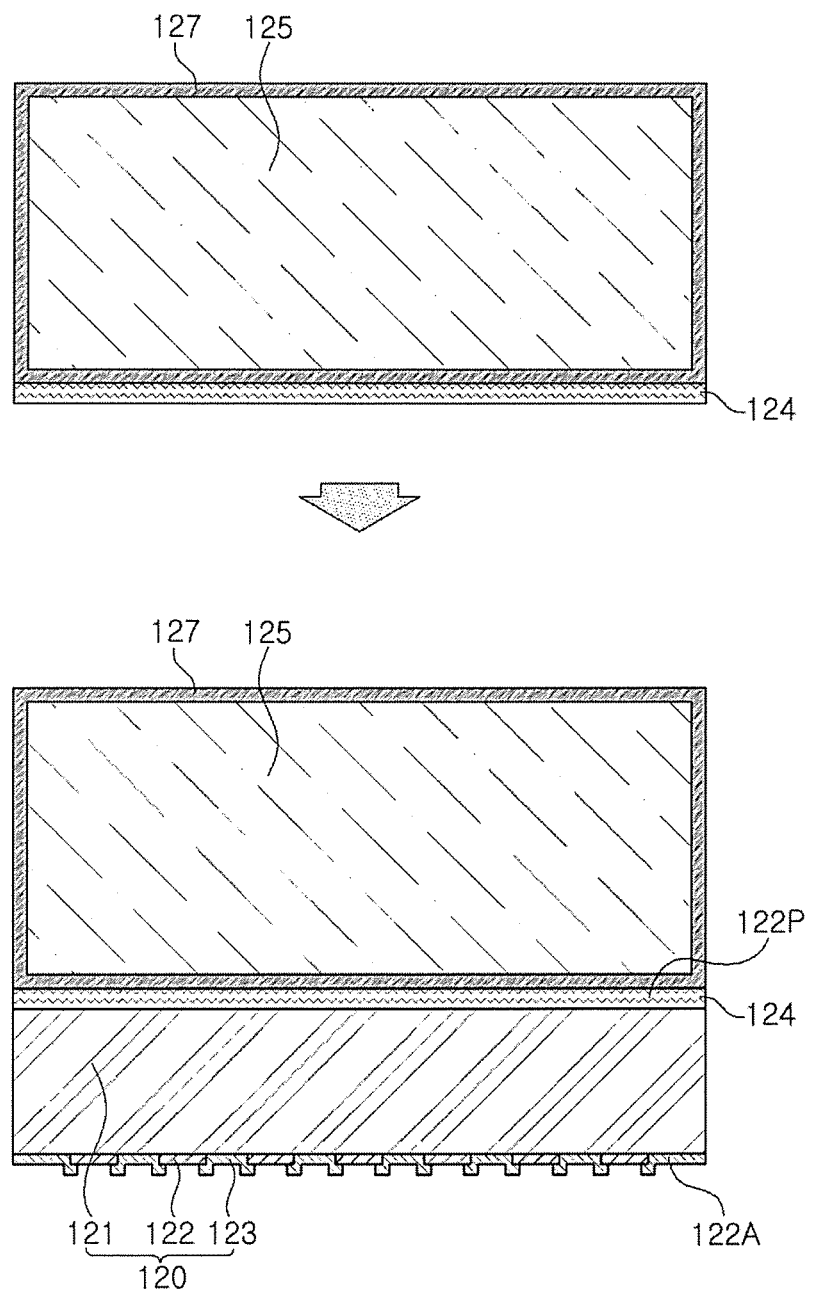
FIGS. 11B and 11C are schematic views illustrating various examples of a process of attaching a heat dissipation member to an inactive surface of a semiconductor chip.
Figure 11C:
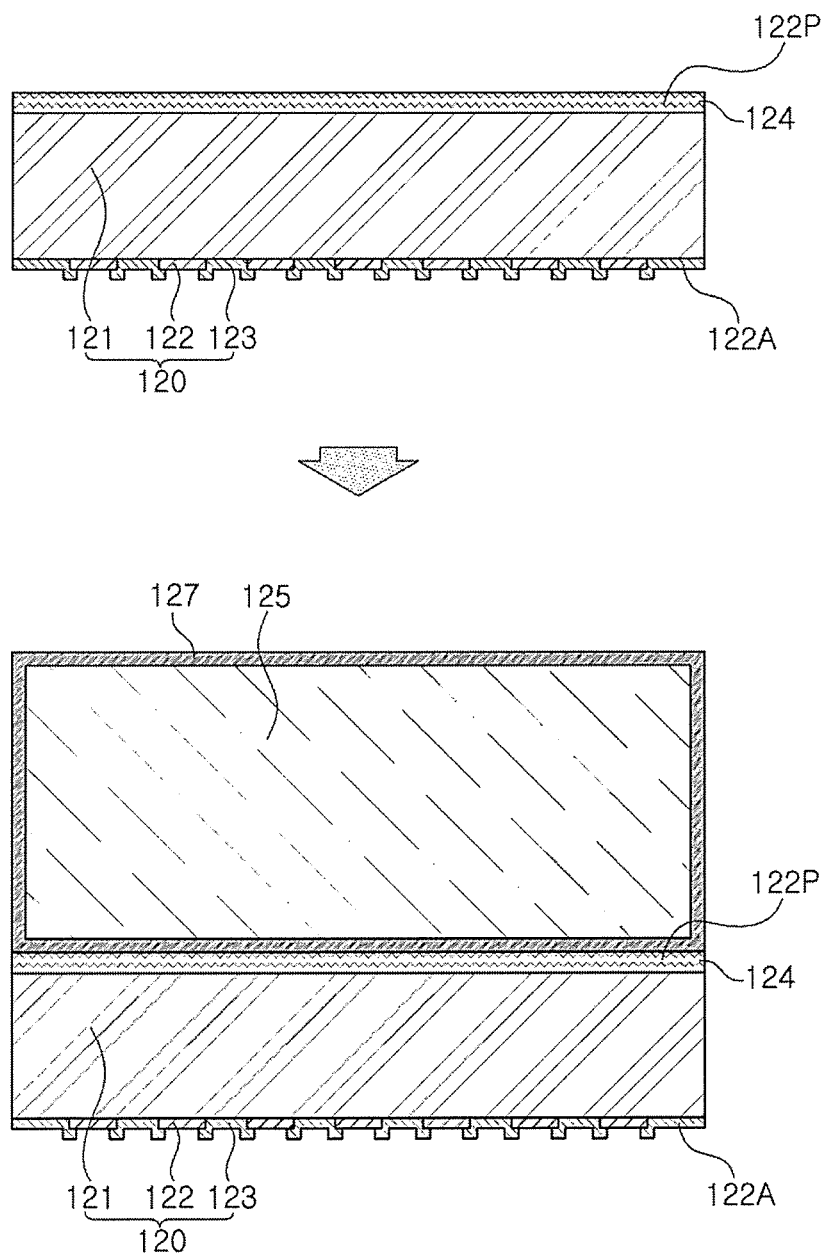

FIGS. 11B and 11C depict schematic views illustrating various examples of a process of attaching a heat dissipation member to an inactive surface of a semiconductor chip.

Referring FIG. 11B, the semiconductor chip 120 to which the heat dissipation member 125 is attached may be obtained by attaching the adhesive film 124 to a lower portion of the heat dissipation member 125 on which the organic coating layer 127 is formed by the surface treatment and then attaching the heat dissipation member 125 on which the organic coating layer 127 is formed to the inactive surface 122P of the semiconductor chip 120 through the adhesive film 124. If necessary, a series of processes may be performed by attaching the coated heat dissipation member 125 to the semiconductor chip 120 in a wafer state through the adhesive film 124 and then dicing the semiconductor chip 120 to which the heat dissipation member 125 is attached by a dicing process.

Alternatively, referring to FIG. 11C, the semiconductor chip 120 to which the heat dissipation member 125 is attached may be obtained by attaching the adhesive film 124 to the inactive surface of the semiconductor chip 120 and then attaching the heat dissipation member 125 on which the organic coating layer 127 is formed by the surface treatment to the adhesive film 124. If necessary, a series of processes may be performed by attaching the adhesive film 124 to the semiconductor chip 120 in a wafer state, attaching the coated heat dissipation member 125 to the adhesive film 124, and then dicing the semiconductor chip 120 to which the heat dissipation member 125 is attached by a dicing process.

Figure 12A:
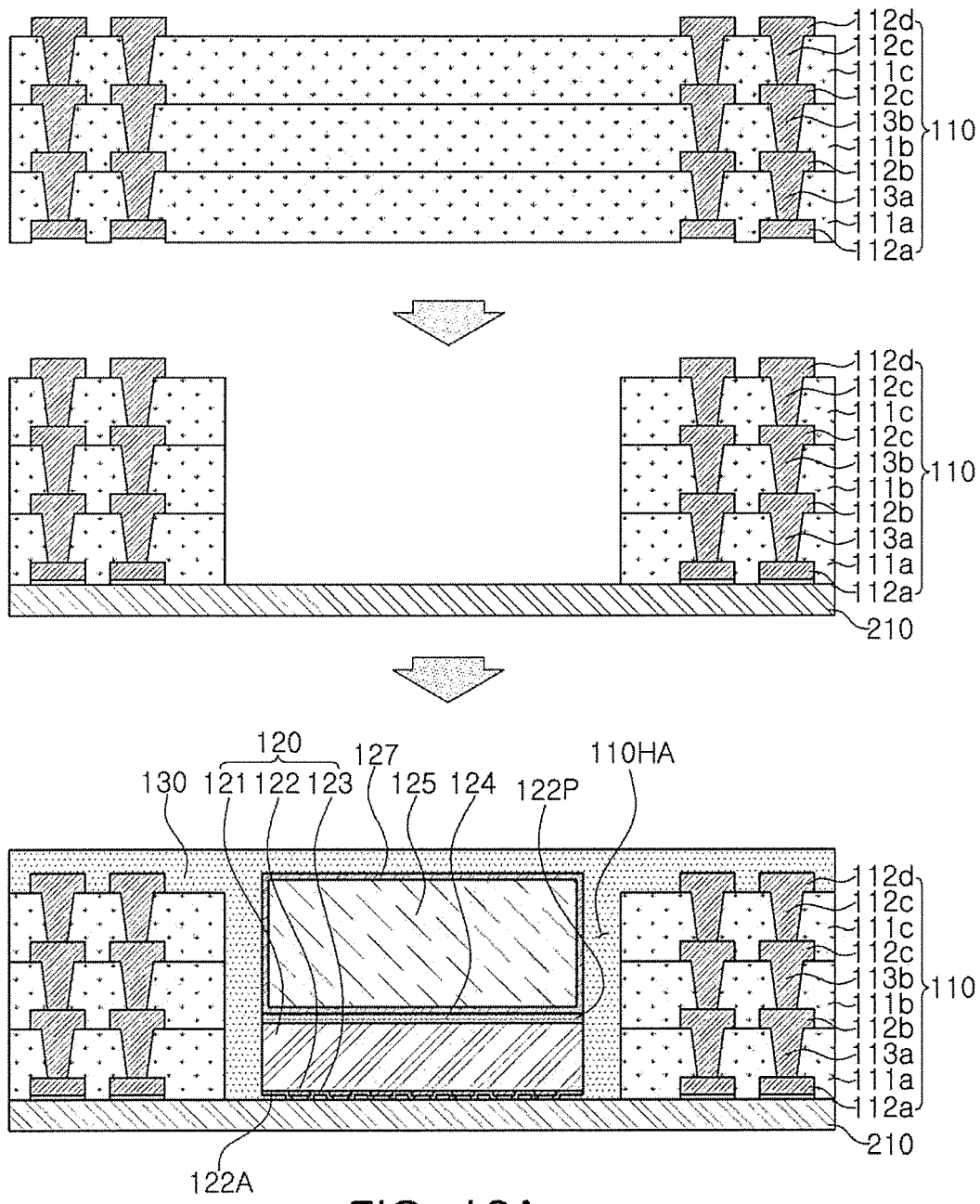
FIGS. 12A and 12B are schematic views illustrating an example of processes of manufacturing the fan-out semiconductor package.
Figure 12B:
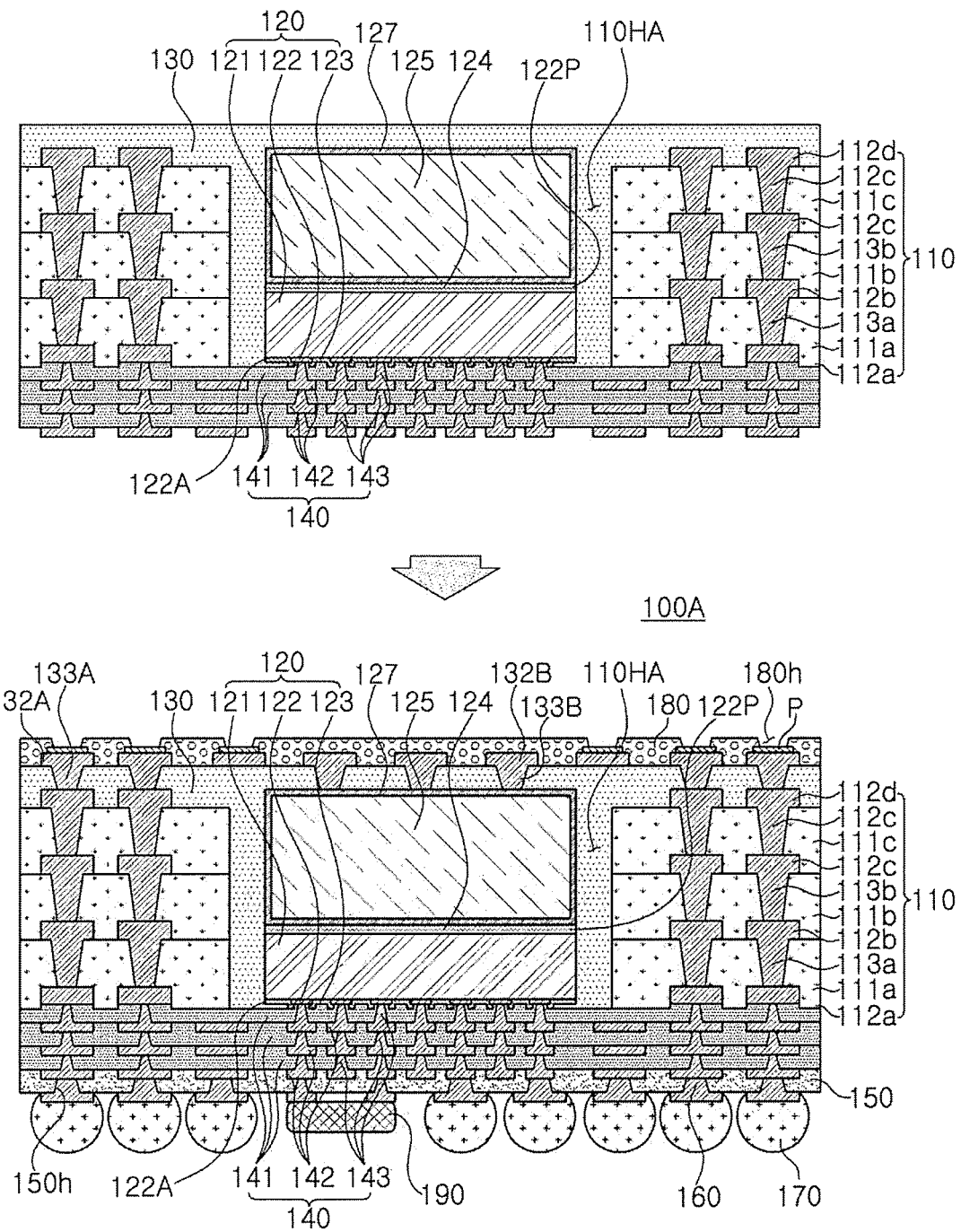

FIGS. 12A and 12B are schematic views illustrating an example of processes of manufacturing the fan-out semiconductor package.

Referring to FIG. 12A, the core member 110 may be first prepared. The core member 110 may be manufactured using a coreless substrate. In detail, the core member 110 may be prepared by repeating a series of processes forming the first wiring layer 112a on the coreless substrate by a plating process, forming the first insulating layer 111a by laminating ABF, or the like, forming laser via holes in the first insulating layer 111a using some pad patterns of the first wiring layer 112a as stoppers, and forming the second wiring layer 112b and the first connection via layer 113a by a plating process, and then separating and removing the coreless substrate. A metal layer remaining on a lower surface of the core member 110 after the coreless substrate is separated may be removed by etching. In this case, the step portion may be formed between the lower surface of the first insulating layer 111a and the lower surface of the first wiring layer 112a of the core member 110. Then, the through-hole 110H may be formed in the core member 110 using a laser drill, a mechanical drill, or the like, and a tape 210 may be attached to a lower portion of the core member 110. Then, the semiconductor chip 120 to which the heat dissipation member 125 is attached may be attached to the tape 210 in the through-hole 110H, and the encapsulant 130 may be formed by ABF lamination, or the like.

Then, referring to FIG. 12B, the tape 210 may be removed, and the connection member 140 may be formed in a region in which the tape 210 is removed. The connection member 140 may be formed by repeating a series of processes of forming the insulating layer 141 by PID coating, forming photo via holes in the insulating layer 141 by a photolithography method, and forming the redistribution layer 142 and the connection vias 143 by a plating process. Then, the backside wiring layer 132A, the heat dissipation pattern layer 132B, the backside vias 133A, the heat dissipation vias 133B, and the like, may be formed by forming laser via holes in the encapsulant 130 and then performing plating, or the passivation layer 150 and the cover layer 180 may be formed at opposite sides of the fan-out semiconductor package 100A, respectively, through ABF lamination, or the like, the openings 150h and 180h may be formed in the passivation layer 150 and the cover layer 180, respectively, using a laser drill, or the like, the underbump metals 160 may be formed by plating, the electrical connection structures 170 may be formed using solder materials, and a ref low process may thus be performed. The fan-out semiconductor package 100A according to the exemplary embodiment described above may be formed by a series of processes.

The series of processes described above may be performed using a core member 110 having a large size, that is, a panel size. In this case, a plurality of fan-out semiconductor packages 100A may be formed through the core member 110 having the panel size, and when the plurality of fan-out semiconductor packages 100A are separated from one another by a dicing process, the plurality of fan-out semiconductor packages 100A may be obtained by performing one process.

Figure 13:
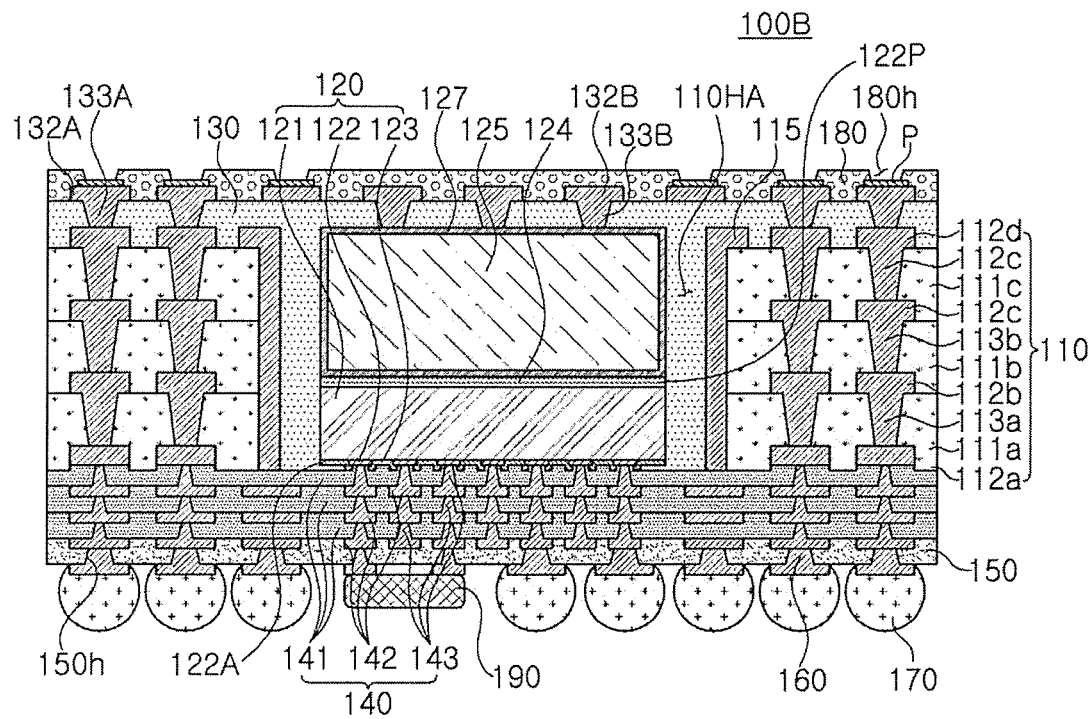
FIG. 13 is a schematic cross-sectional view illustrating another example of a fan-out semiconductor package.

FIG. 13 is a schematic cross-sectional view illustrating another example of a fan-out semiconductor package.

Referring to FIG. 13, a fan-out semiconductor package 100B according to another exemplary embodiment in the present disclosure may further include a metal layer 115 formed on walls of the through-hole 110H. The metal layer 115 may extend to an upper surface of the core member 110, and may be electrically connected to ground patterns of the wiring layers 112a, 112b, 112c, and 112d of the core member 110 and/or ground patterns of the redistribution layers 142 of the connection member 140. Heat generated from the semiconductor chip 120 may be effectively transferred to side portions of the fan-out semiconductor package 100B through the metal layer 115, and may thus be more easily dissipated externally. The metal layer 115 may be formed of the same conductive material as that of each of the wiring layers 112a, 112b, 112c, and 112d of the core member 110. Other contents overlap those described above, and a detailed description thereof is thus omitted.

Figure 14:
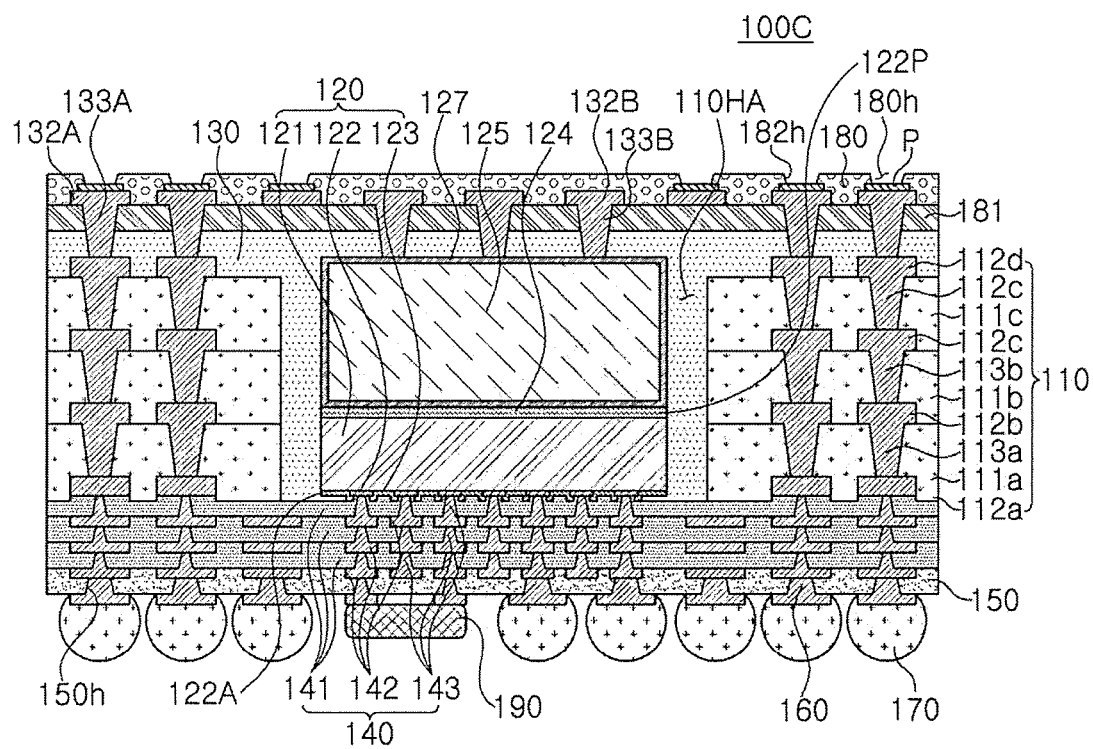
FIG. 14 is a schematic cross-sectional view illustrating another example of a fan-out semiconductor package.

FIG. 14 is a schematic cross-sectional view illustrating another example of a fan-out semiconductor package.

Referring to FIG. 14, a fan-out semiconductor package 100C according to another exemplary embodiment in the present disclosure may further include a reinforcing layer 181. The reinforcing layer 181 may be disposed between the encapsulant 130, and the backside wiring layer 132A and the heat dissipation pattern layer 132B. Warpage of the fan-out semiconductor package 100C may be more effectively suppressed by disposing the reinforcing layer 181. In this regard, the reinforcing layer 181 may have an elastic modulus greater than those of the encapsulant 130 and the cover layer 180. For example, prepreg, a unclad copper clad laminate, or the like, including an insulating resin, an inorganic filler, and a glass fiber, may be used as a material of the reinforcing layer 181, and ABF, or the like, including an insulating layer and an inorganic filler may be used as a material of each of the encapsulant 130 and the cover layer 180. The backside vias 133A and the heat dissipation vias 133B may also penetrate through the reinforcing layer 181. If necessary, a resin layer (not illustrated) may further be disposed between the reinforcing layer 181, and the backside wiring layer 132A and the heat dissipation pattern layer 1323, in order to more easily form openings in the reinforcing layer 181. Other contents overlap those described above, and a detailed description thereof is thus omitted.

Figure 15:
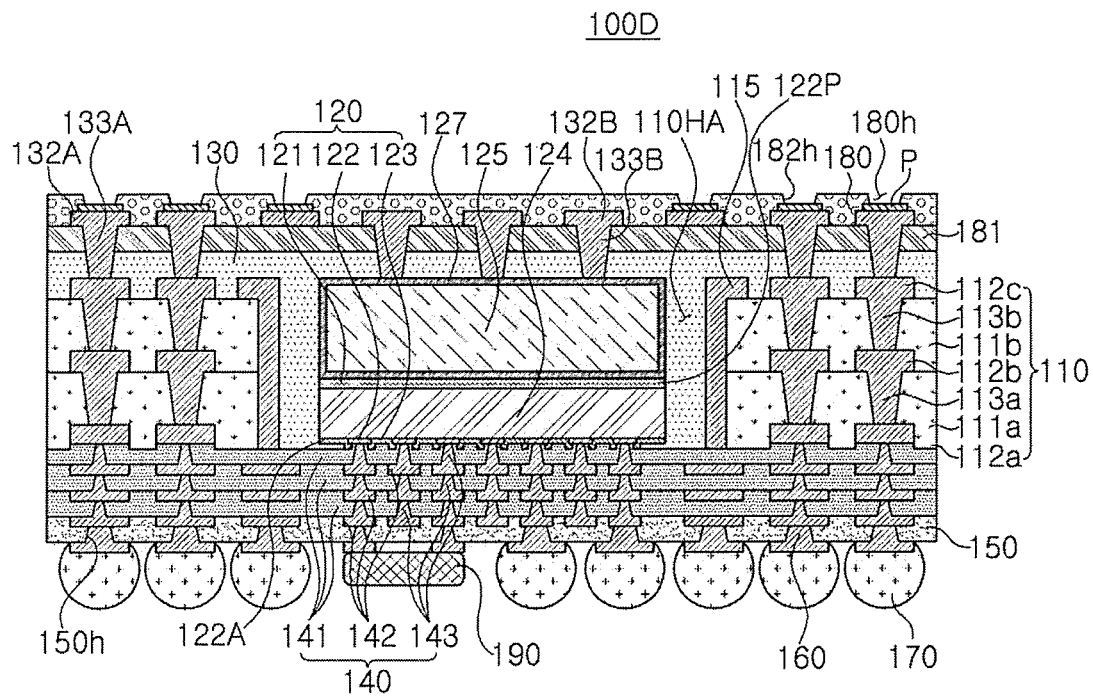
FIG. 15 is a schematic cross-sectional view illustrating another example of a fan-out semiconductor package.

FIG. 15 is a schematic cross-sectional view illustrating another example of a fan-out semiconductor package.

Referring to FIG. 15, in a fan-out semiconductor package 100D according to another exemplary embodiment in the present disclosure, the third insulating layer 111c, the third connection via layers 113, and the fourth wiring layer 112d may be omitted in the core member 110. That is, the numbers of insulating layers, wiring layers, and connection via layers of the core member 110 may be various. In this case, a thickness of the core member 110 may be changed, and thicknesses of the semiconductor chip 120 and the heat dissipation member 125 may thus be changed depending on the changed thickness of the core member 110 by a grinding process, or the like. However, also in this case, it may be advantageous in terms of a heat dissipation effect that the thickness of the semiconductor chip 120 is about 0.4 to 0.6 times the thickness of the heat dissipation member 125.

Other contents overlap those described above, and a detailed description thereof is thus omitted.

Figure 16:
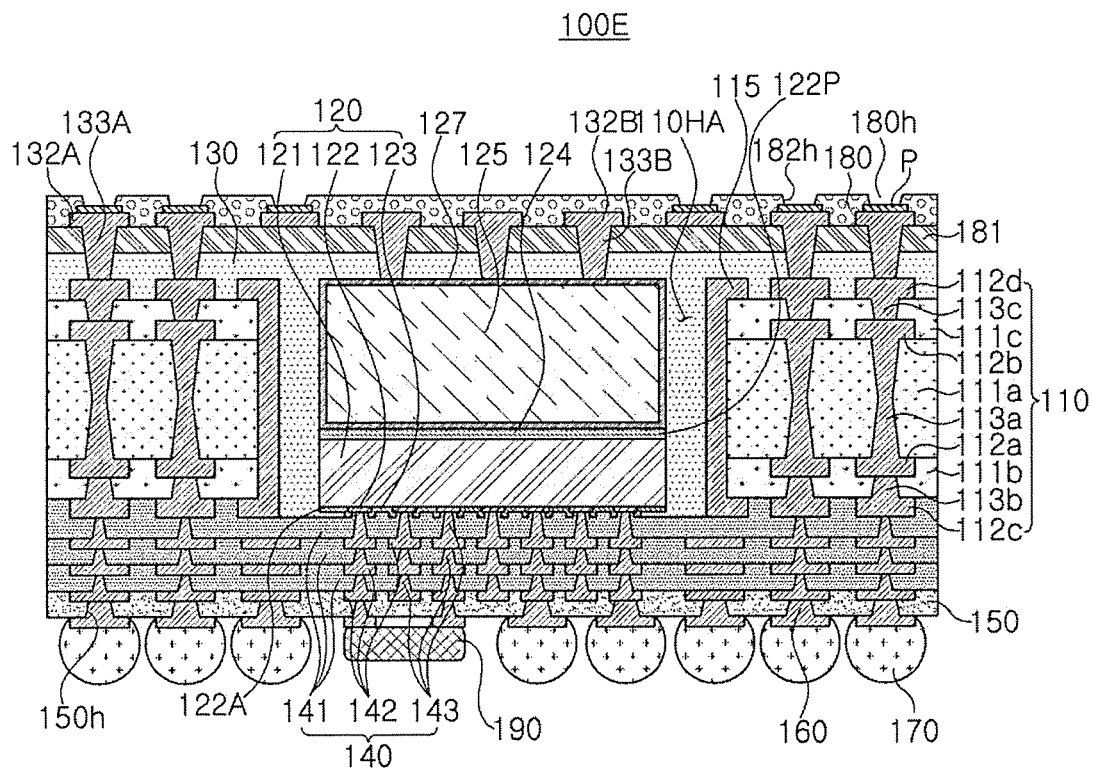
FIG. 16 is a schematic cross-sectional view illustrating another example of a fan-out semiconductor package.

FIG. 16 is a schematic cross-sectional view illustrating another example of a fan-out semiconductor package.

Referring to FIG. 16, in a fan-out semiconductor package 100E according to another exemplary embodiment in the present disclosure, a core member 110 may include a first insulating layer 111a, a first wiring layer 112a and a second wiring layer 112b disposed on a lower surface and an upper surface of the first insulating layer 111a, respectively, a second insulating layer 111b disposed on the lower surface of the first insulating layer 111a and covering the first wiring layer 112a, a third wiring layer 112c disposed on a lower surface of the second insulating layer 111b, a third insulating layer 111c disposed on the upper surface of the first insulating layer 111a and covering the second wiring layer 112b, and a fourth wiring layer 112d disposed on an upper surface of the third insulating layer 111c. The first to fourth wiring layers 112a, 112b, 112c, and 112d may be electrically connected to connection pads 122. Since the core member 110 may include a large number of wiring layers 112a, 112b, 112c, and 112d, a connection member 140 may be simplified. Therefore, a decrease in a yield depending on a defect occurring in a process of forming the connection member 140 may be suppressed. Meanwhile, the first to fourth wiring layers 112a, 112b, 112c, and 112d may be electrically connected to each other through first to third connection via layers 113a, 113b, and 113c each penetrating through the first to third insulating layers 111a, 111b, and 111c.

The first insulating layer 111a may have a thickness greater than those of the second insulating layer 111b and the third insulating layer 111c. The first insulating layer 111a may be relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg including a glass fiber, an inorganic filler, and an insulating resin, and the second insulating layer 111b and the third insulating layer 111c may be an ABF or a PID film including an inorganic filler and an insulating resin. However, the materials of the first insulating layer 111a and the second and third insulating layers 111b and 111c are not limited thereto. Similarly, the first connection via layer 113a penetrating through the first insulating layer 111a may have a diameter greater than those of the second and third connection via layers 113b and 113c each penetrating through the second and third insulating layers 111b and 111c.

A lower surface of the third wiring layer 112c of the core member 110 may be disposed on a level below a lower surface of the connection pad 122 of a semiconductor chip 120. In addition, a distance between a redistribution layer 142 of the connection member 140 and the third wiring layer 112c of the core member 110 may be smaller than that between the redistribution layer 142 of the connection member 140 and the connection pad 122 of the semiconductor chip 120. The reason is that the third wiring layer 112c may be disposed on the second insulating layer 111b in a protruding form, resulting in being in contact with the connection member 140. The first wiring layer 112a and the second wiring layer 112b of the core member 110 may be disposed on a level between an active surface and an inactive surface of the semiconductor chip 120. A thickness of each of the wiring layers 112a, 112b, 112c, and 112d of the core member 110 may be greater than that of each of the redistribution layers 142 of the connection member 140. The first connection via layers 113a may have a hourglass shape, and the second and third connection via layers 113b and 113c may have tapered shapes of which directions are opposite to each other. A detailed description of other configurations overlaps that described above, and is, thus, omitted.

Figure 17:
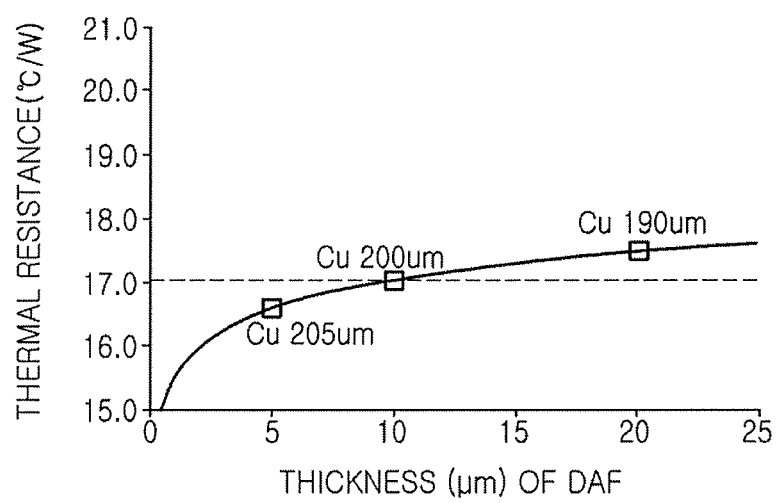
FIG. 17 is a graph schematically illustrating a heat dissipation effect of the fan-out semiconductor package manufactured according to an example.

FIG. 17 is a graph schematically illustrating a heat dissipation effect of the fan-out semiconductor package manufactured according to an example.

In an experiment, the copper lump was used as the material of the heat dissipation member, and the die attach film (DAF) was used as the adhesive film. In this case, the sum of thicknesses of the copper lump and the DAF was set to about 210 μm, and a thickness of the semiconductor chip was fixed to about 100 μm. A structure of the fan-out semiconductor package 100A according to the exemplary embodiment described above was used as a basic structure of a package. An interposer package on package (IPOP) according to the related art has a thermal resistance of about 20° C./W. However, it may be seen from FIG. 17 that a thermal resistance of the fan-out semiconductor package according to the exemplary embodiment may be lowered to about 17° C./W or less. In this case, it may be seen that it is advantageous that a thickness of the DAF is 10 μm or less. The reason is that the fan-out semiconductor package has a thermal resistance of 17° C./W or less when the thickness of the DAF is 10 μm or less.

As set forth above, according to an exemplary embodiment in the present disclosure, a fan-out semiconductor package of which heat dissipation characteristics may be excellent and warpage may be effectively controlled may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
   a semiconductor chip comprising:
      an active surface comprising connection pads disposed thereon; and
      an inactive surface opposing the active surface; and
      a first side surface extending substantially perpendicular to the active surface and the inactive surface of the semiconductor chip;
   a heat dissipation layer attached to the inactive surface of the semiconductor chip and comprising a second side surface extending substantially perpendicular to the active surface and the inactive surface of the semiconductor chip;
   an encapsulant covering at least portions of each of the semiconductor chip and the heat dissipation layer; and
   a connection layer disposed on the active surface of the semiconductor chip and comprising a redistribution layer electrically connected to the connection pads,
   wherein the heat dissipation layer has a thickness greater than that of the semiconductor chip, and
   wherein the first side surface of the semiconductor chip and the second side surface of the heat dissipation layer are coplanar.

2. The fan-out semiconductor package of claim 1, wherein the thickness of the semiconductor chip is 0.4 to 0.6 times the thickness of the heat dissipation layer.

3. The fan-out semiconductor package of claim 1, wherein the heat dissipation layer is attached to the inactive surface of the semiconductor chip by an adhesive film.

4. The fan-out semiconductor package of claim 3, wherein the adhesive film comprises a die attach film (DAF) having a thickness of 1 μm to 10 μm.

5. The fan-out semiconductor package of claim 1, wherein the heat dissipation layer comprises a copper (Cu) lump.

6. The fan-out semiconductor package of claim 5, wherein an organic coating layer is formed on the Cu lump.

7. The fan-out semiconductor package of claim 6, wherein the organic coating layer comprises a silane coating layer.

8. The fan-out semiconductor package of claim 1, wherein the encapsulant comprises an insulating resin and an inorganic filler, and
a content of the inorganic filler in the encapsulant is 60 wt % to 80 wt %.

9. The fan-out semiconductor package of claim 1, further comprising:
a heat dissipation pattern layer disposed on the encapsulant; and
heat dissipation vias penetrating through at least portions of the encapsulant and connecting the heat dissipation pattern layer and the heat dissipation layer to each other.

10. A fan-out semiconductor package comprising:
a semiconductor chip comprising:
an active surface comprising connection pads disposed thereon; and
an inactive surface opposing the active surface;
a heat dissipation layer attached to the inactive surface of the semiconductor chip;
an encapsulant covering at least portions of each of the semiconductor chip and the heat dissipation layer;
a connection layer disposed on the active surface of the semiconductor chip and comprising a redistribution layer electrically connected to the connection pads;
a heat dissipation pattern layer disposed on the encapsulant;
a reinforcing layer disposed between the encapsulant and the heat dissipation pattern layer; and
a cover layer disposed on the reinforcing layer and covering at least portions of the heat dissipation pattern layer,
wherein the heat dissipation layer has a thickness greater than that of the semiconductor chip, and
wherein the reinforcing layer has an elastic modulus greater than that of each of the encapsulant and the cover layer.

11. The fan-out semiconductor package of claim 1, further comprising a core member comprising a through-hole, wherein;
the semiconductor chip and the heat dissipation layer are disposed in the through-hole, and
the encapsulant covers at least portions of the core member, the semiconductor chip, and the heat dissipation layer, and fills at least portions of the through-hole.

12. The fan-out semiconductor package of claim 11, wherein:
the core member comprises a plurality of wiring layers, and
the plurality of wiring layers of the core member are electrically connected to the connection pads of the semiconductor chip through the redistribution layer of the connection layer.

13. The fan-out semiconductor package of claim 12, further comprising:
a backside wiring layer disposed on the encapsulant; and
backside vias penetrating through at least portions of the encapsulant and electrically connecting the backside wiring layer and an uppermost wiring layer of the plurality of wiring layers of the core member to each other.

14. A fan-out semiconductor package comprising
a semiconductor chip comprising:
an active surface comprising connection pads disposed thereon; and
an inactive surface opposing the active surface;
a heat dissipation layer attached to the inactive surface of the semiconductor chip;
an encapsulant covering at least portions of each of the semiconductor chip and the heat dissipation layer;
a connection layer disposed on the active surface of the semiconductor chip and comprising a redistribution layer electrically connected to the connection pads;
a core member comprising:
a through-hole; and
a plurality of wiring layers;
a backside wiring layer disposed on the encapsulant;
backside vias penetrating through at least portions of the encapsulant and electrically connecting the backside wiring layer and an uppermost wiring layer of the plurality of wiring layers of the core member to each other;
a reinforcing layer disposed between the encapsulant and the backside wiring layer; and
a cover layer disposed on the reinforcing layer and covering at least portions of the backside wiring layer,
wherein the heat dissipation layer has a thickness greater than that of the semiconductor chip, and
wherein the reinforcing layer has an elastic modulus greater than that of each of the encapsulant and the cover layer.

15. The fan-out semiconductor package of claim 12, wherein the core member further comprises:
a first insulating layer in contact with the connection layer;
a first wiring layer embedded in the first insulating layer and in contact with the connection layer;
a second wiring layer disposed on a second surface of the first insulating layer opposing a first surface of the first insulating layer in which the first wiring layer is embedded;
a second insulating layer disposed on the first insulating layer and covering the second wiring layer; and
a third wiring layer disposed on the second insulating layer, and
the first wiring layer, the second wiring layer and the third wiring layer are electrically connected to the connection pads of the semiconductor chip.

16. The fan-out semiconductor package of claim 15, wherein the core member further comprises:
a third insulating layer disposed on the second insulating layer and covering the third wiring layer, and
a fourth wiring layer disposed on the third insulating layer, and
the first to fourth wiring layers are electrically connected to the connection pads of the semiconductor chip.

17. The fan-out semiconductor package of claim 15, wherein a lower surface of the first wiring layer and a lower surface of the first insulating layer have a step portion provided therebetween.

18. The fan-out semiconductor package of claim 12, wherein the core member comprises:

a first insulating layer;

a first wiring layer disposed on a lower surface of the first insulating layer; and a second wiring layer disposed on an upper surface of the first insulating layer, and the first wiring layer and the second wiring layer are electrically connected to the connection pads of the semiconductor chip.

19. The fan-out semiconductor package of claim 18, wherein the core member further comprises:

a second insulating layer disposed on the lower surface of the first insulating layer and covering the first wiring layer;

a third wiring layer disposed on a lower surface of the second insulating layer;

a third insulating layer disposed on the upper surface of the first insulating layer and covering the second wiring layer; and a fourth wiring layer disposed on an upper surface of the third insulating layer, and the first to fourth wiring layers are electrically connected to the connection pads of the semiconductor chip.

20. The fan-out semiconductor package of claim 19, wherein the first insulating layer has a thickness greater than that of each of the second insulating layer and the third insulating layer.

\* \* \* \* \*